(12) United States Patent
Fehrenbach et al.

(10) Patent No.: US 10,608,160 B2
(45) Date of Patent: Mar. 31, 2020

(54) VIBRATION SENSOR WITH INTEGRATED TEMPERATURE DETECTION

(71) Applicant: VEGA GRIESHABER KG, Wolfach (DE)

(72) Inventors: Dominik Fehrenbach, Haslach (DE); Volker Allgaier, Haslach (DE)

(73) Assignee: Vega Grieshaber KG, Wolfach (DE)

( * ) Notice: Subject to any disclaimer, the term of this patent is extended or adjusted under 35 U.S.C. 154(b) by 191 days.

(21) Appl. No.: 15/787,614

(22) Filed: Oct. 18, 2017

(65) Prior Publication Data

US 2018/0130939 A1 May 10, 2018

(30) Foreign Application Priority Data

Oct. 20, 2016 (EP) .................................... 16194931

(51) Int. Cl.
| | | |
|---|---|---|
| *H01L 41/04* | (2006.01) | |
| *G01H 11/08* | (2006.01) | |
| *G01K 7/34* | (2006.01) | |
| *H01L 41/113* | (2006.01) | |

(52) U.S. Cl.
CPC ........... *H01L 41/042* (2013.01); *G01H 11/08* (2013.01); *G01K 7/34* (2013.01); *H01L 41/1132* (2013.01)

(58) Field of Classification Search
CPC ........ G01L 41/042; G01H 11/08; G01K 7/34; H01L 41/1132
USPC .......................................................... 73/649
See application file for complete search history.

(56) References Cited

U.S. PATENT DOCUMENTS

| | | | | |
|---|---|---|---|---|
| 9,214,623 | B1 * | 12/2015 | Thalmayr | ................ H03H 9/56 |
| 9,995,617 | B2 * | 6/2018 | Muller | ................ G01F 23/2966 |
| 2002/0014117 | A1 * | 2/2002 | Raffalt | ................ G01F 23/2967 |
| | | | | 73/290 V |
| 2005/0145019 | A1 * | 7/2005 | Matsiev | ................ G01N 9/002 |
| | | | | 73/53.01 |
| 2010/0100989 | A1 * | 4/2010 | Fragala | ................ G01Q 20/04 |
| | | | | 850/5 |
| 2011/0179860 | A1 * | 7/2011 | Urban | ................ G01F 23/2967 |
| | | | | 73/32 A |

(Continued)

FOREIGN PATENT DOCUMENTS

| | | |
|---|---|---|
| DE | 198 05 184 A1 | 2/1998 |
| EP | 2801 799 A1 | 5/2013 |
| JP | 2012 013440 A | 1/2012 |

OTHER PUBLICATIONS

Kawada, Shinichiro Materials 2015, 8(11), 7423-7438; https://doi.org/10.3390/ma8115389 Review Potassium Sodium Niobate-Based Lead-Free Piezoelectric Multilayer Ceramics Co-Fired with Nickel Electrodes (Year: 2015).*

(Continued)

*Primary Examiner* — Natalie Huls
*Assistant Examiner* — Monica S Young
(74) *Attorney, Agent, or Firm* — William Gray Mitchell

(57) ABSTRACT

A vibration sensor with a diaphragm that can be set into vibration, a piezo-electric drive for setting the diaphragm into vibration and for detecting vibrations in the diaphragm, with the drive having at least two serial mechanical piezo elements, a temperature sensor, with at least a first piezo element made from a first piezo-electric material and at least a second piezo element made from a second piezo-electric material.

12 Claims, 6 Drawing Sheets

(56) References Cited

U.S. PATENT DOCUMENTS

| | | | | |
|---|---|---|---|---|
| 2013/0104647 A1* | 5/2013 | Lopatin | ................ | G01D 3/0365 |
| | | | | 73/292 |
| 2014/0292153 A1* | 10/2014 | Sinha | ....................... | H03H 3/04 |
| | | | | 310/346 |
| 2014/0333176 A1* | 11/2014 | Gruhler | ............... | G01F 23/2968 |
| | | | | 310/316.01 |
| 2015/0233808 A1* | 8/2015 | Motoyoshi | ............. | G01N 11/16 |
| | | | | 702/50 |
| 2015/0340591 A1* | 11/2015 | Zhang | .................... | H01L 41/18 |
| | | | | 310/360 |
| 2017/0025596 A1* | 1/2017 | Qiu | ........................ | H01P 1/201 |
| 2017/0194934 A1* | 7/2017 | Shelton | .............. | H01L 41/0973 |
| 2017/0310302 A1* | 10/2017 | Bauder | ................. | H03H 9/584 |

OTHER PUBLICATIONS

NASA/ CR-1998-208708 Properties of PZT-Based Piezoelectric Ceramics Between −150 and 250° C. Matthew W. Hooker Lockheed Martin Engineering & Sciences Co., Hampton, Virginia National Aeronautics and Space Administration Langley Research Center Hampton, Virginia 23681-2199, Sep. 1998. (Year: 1998).*

EPO search report for related application 16 194931.8, dated Apr. 25, 2017.

Damjanovic et al., Ferroelectric Sensors, IEEE Sensors Journal, IEEE Service Center, New York, NY, U.S. Oct. 3, 2001.

\* cited by examiner

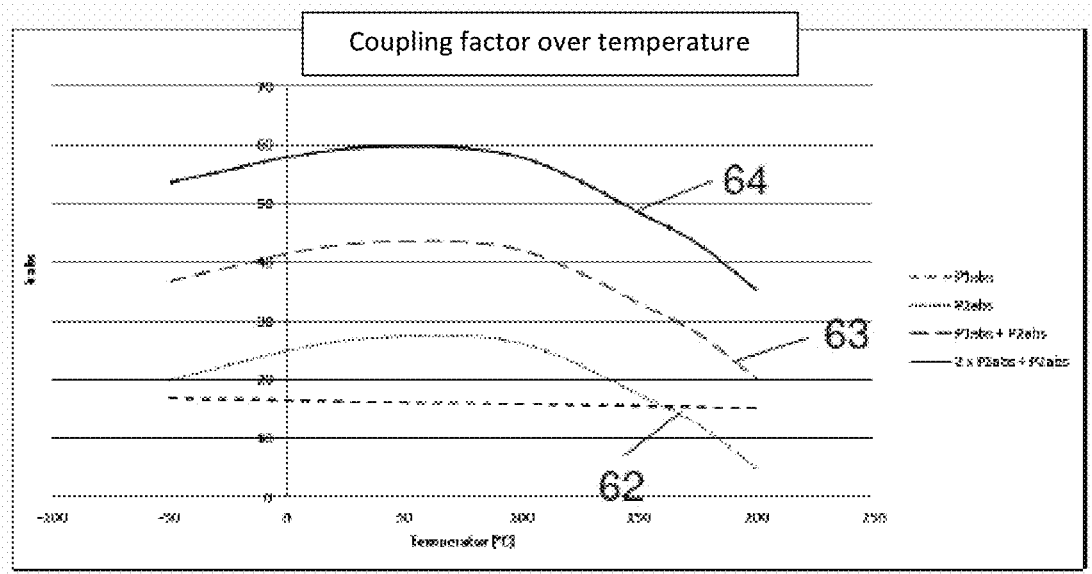

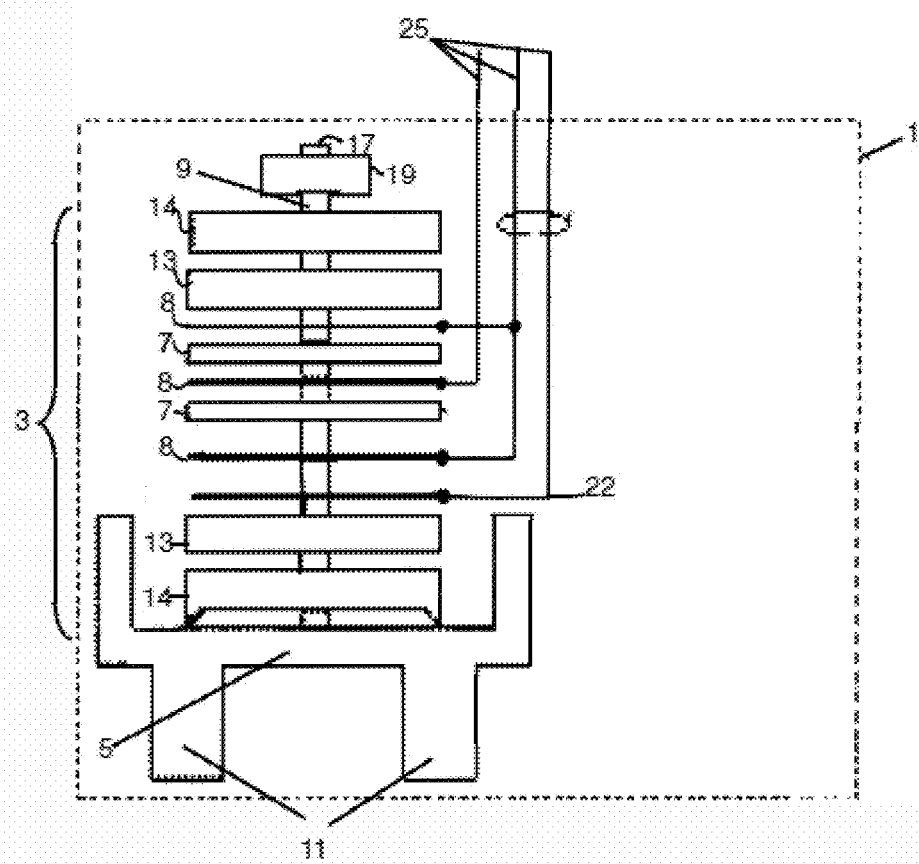
Vibration sensor
Prior art

VIBRATION SENSOR WITH INTEGRATED TEMPERATURE DETECTION

CROSS REFERENCE TO RELATED APPLICATIONS

This patent application claims priority to European Patent Application 16194931.8, filed on Oct. 10, 2016.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention is an vibration sensor with integrated temperature detection.

Background of the Invention

The present invention relates to a piezo-electrically operated vibration limit switch with an integrated temperature detection according to the preamble of claim 1.

In prior art, vibration sensors, which are used, for example, as vibration limit switches, are known, with the vibration sensor comprising a diaphragm that can be excited by a drive to vibrate, and this way the mechanical vibrator, arranged at the diaphragm, can be excited to a vibration. Depending on a cover status of the mechanical vibrator with fill material, as well as depending on the viscosity of this fill material, the mechanical vibrator oscillates with a characteristic frequency, which can be detected by a vibration sensor and can be converted into a measuring signal.

FIG. 8 shows a piezo-electrically operated vibration sensor 1 known from prior art, which can be used particularly as a vibration limit switch. The vibration sensor comprises a diaphragm 5 that can be excited via a drive 3 to vibrate, with the drive 3 showing a plurality of ring-like embodied piezo elements 7 with an opening 9 and an electric contacting of the piezo elements 7. Typically, the piezo elements 7 are stressed via a tension bolt 17, arranged at the diaphragm 5 of the vibration sensor 1, which extends through the opening 9 of the piezo elements 7, against the diaphragm 5 using a clamping screw 19 such that any vibration of the piezo elements 7 generated by an electric signal is reliably transferred to the diaphragm 5. Typically, an adjustment ceramic 13 and a spring washer 14 are arranged between the piezo elements 7 and the diaphragm 5, which ensure the targeted introduction of the mechanical vibration into the diaphragm 5 as well as the electric isolation of the piezo elements 7 in reference to the diaphragm 5, typically embodied from metal, as well as a thermal adjustment. Similar to the adjustment ceramic 13 and the spring washer 14 between the diaphragm 5 and the piezo elements 7, additionally another adjustment ceramic 13 and a spring washer 14 between the clamping screw 19 and the piezo elements 7 may be provided such that the clamping screw 19 is also electrically isolated from the piezo elements 7.

In reference to the tension bolt 17, the piezo elements 7 can be isolated via the sleeve 10, arranged in the opening 9 and shown here not any higher.

An electric contacting of the piezo elements 7 occurs via electrodes 8 arranged at the surfaces of the piezo elements 7 and contacted via cables 25 from the outside.

Typically, two mechanical vibrators 11 embodied as paddles are arranged on the side of the diaphragm 5 facing away from the drive 3, which transfer the vibration coupled into the diaphragm 5 to a medium surrounding the mechanical vibrators 11.

Vibration sensors of the type described above, particularly vibration limit switches for liquids, operate based on the principle of resonance frequency shift. The vibration limit switch oscillates depending on the coverage status, density, and temperature of the medium with various resonance frequencies and amplitudes. The amplitude of the resonance frequency is here dependent on the viscosity of the medium. The frequency shift is dependent on the density and temperature of the medium.

In order to allow compensating the influences of the temperature upon the resonance frequency, the temperature at the piezo-drive and/or the vibration element must be known.

The influence of the temperature upon the resonance frequency is known from the material constants of the materials used, particularly those of the diaphragm and the vibration element. When the temperature is known, here any resonance frequency shift generated by temperature influences can be compensated. In prior art, a temperature sensor is installed in the drive, marked 22 in FIG. 8, e.g. of the type PT100.

A vibration sensor known from prior art is therefore considered disadvantageous in that a temperature sensor is necessary for detecting the temperature as an additional component with additional need for structural space, leading to cost increases and additional wiring.

The objective of the present invention is to improve a vibration sensor with an integrated temperature detection such that no separate sensor is necessary.

This objective is attained in a vibration sensor showing the features as described herein.

BRIEF SUMMARY OF THE INVENTION

In a preferred embodiment, a vibration sensor (1) with an integrated temperature detection
  a diaphragm (5) that can be set into vibration,
  a piezo-electric drive (3) for setting the diaphragm (3) into vibration and for detecting vibrations of the diaphragm (3), with the drive comprising at least two serial mechanical piezo elements (71, 72), characterized in that
  at least a first piezo element (71) is formed from a first piezo-electric material and at least a second piezo element (72) from a second piezo-electric material, and a temperature is determined by detecting a capacity of at least one piezo element.

In another preferred embodiment, the vibration sensor (1) as described herein, characterized in that a first relative dielectric constant ($\varepsilon_{r1}$) of the first piezo-electric material and a second relative dielectric constant ($\varepsilon_{r1}$) of the second piezo-electric material show a different temperature dependency.

In another preferred embodiment, the vibration sensor (1) as described herein, characterized in that a first coupling factor ($k_1$) has different temperature dependencies in the direction of the material polarization of the first piezo-electric material and a second coupling factor ($k_2$) in the direction of the material polarization of the second piezo-electric material.

In another preferred embodiment, the vibration sensor (1) as described herein, characterized in that the first coupling factor ($k_1$) has an almost linear change in a temperature range from −50° C. to +200° C.

In another preferred embodiment, the vibration sensor as described herein, characterized in that the first coupling factor ($k_1$) has in the temperature range a relative change of less than +/−15%, preferably less than +/−10%, and further preferred +/−5% or less.

In another preferred embodiment, the vibration sensor (1) as described herein, characterized in that the first coupling factor ($k_1$) has in the temperature range values ranging from 10 to 20, preferably from 15 to 20.

In another preferred embodiment, the vibration sensor (1) as described herein, characterized in that the second relative dielectric constant ($\varepsilon_{r2}$) has in the temperature range a relative change of more than +/−10%, preferably more than +/−15%, particularly at least −10% to +30%, preferably at least +50%.

In another preferred embodiment, the vibration sensor (1) as described herein, characterized in that the second relative dielectric constant in the temperature range has a change of at least 30%, preferably at least 50%, particularly at least 80%.

In another preferred embodiment, the vibration sensor (1) as described herein, characterized in that the drive (3) has at least two piezo elements (71, 72) made from the first piezo-electric material.

In another preferred embodiment, the vibration sensor (1) as described herein, characterized in that the drive (3) comprises a coupling factor ($k_1$) of at least 20, preferably at least 35.

In another preferred embodiment, the vibration sensor (1) as described herein, characterized in that a piezo element (71) at the membrane side is made from the second piezo-electric material.

In another preferred embodiment, the vibration sensor (1) as described herein, characterized in that the first piezo element (71) has a Curie point of at least 300° C., preferably at least 320° C.

In another preferred embodiment, the vibration sensor (1) as described herein, characterized in that the second piezo element (72) has a Curie point of 255° C.

In another preferred embodiment, the vibration sensor (1) as described herein, characterized in that the vibration sensor (1) has a radio module for data communication with another unit and parameterization of the vibration sensor (1).

BRIEF DESCRIPTION OF THE DRAWINGS

FIG. 6 is a line drawing evidencing a change of the coupling factor with the temperature for a drive with three piezo elements.

FIG. 8 is a line drawing evidencing a vibration sensor according to prior art.

DETAILED DESCRIPTION OF THE INVENTION

The vibration sensor according to the invention with an integrated temperature detection of a diaphragm set in vibration, a piezo-electric drive for setting the diaphragm into vibration and for detecting vibrations of the diaphragm, with the drive comprising at least two serial mechanical piezo elements, is characterized in that at least one piezo element is made from a first piezo-electric material and at least one second piezo element is made from a second piezo-electric material, and a temperature is determined by detecting a capacity of at least one piezo element.

By using at least two piezo elements made from different piezo-electric materials, it is achieved that the two different piezo elements may show different temperature dependencies for their features, such as coupling factor and dielectric constant. This way, by a suitable material composition, a vibration sensor can be provided with a drive, which can be used in a wide temperature range and also allows an integrated temperature determination.

The selection of different materials is necessary here, since materials showing a coupling factor that is largely constant over a wide temperature range or varying only within a narrow range generally also display a low temperature dependency of their dielectric features, particularly the relative dielectric constant. However, piezo-electric materials with a high temperature dependency of their dielectric features, which are therefore well suited for determining a temperature, also show a high temperature dependency of the coupling factor, with this particularly collapsing considerably during the approach of the Curie point of the respective material, so that the effectiveness of the drive is largely reduced here.

Figure 7:
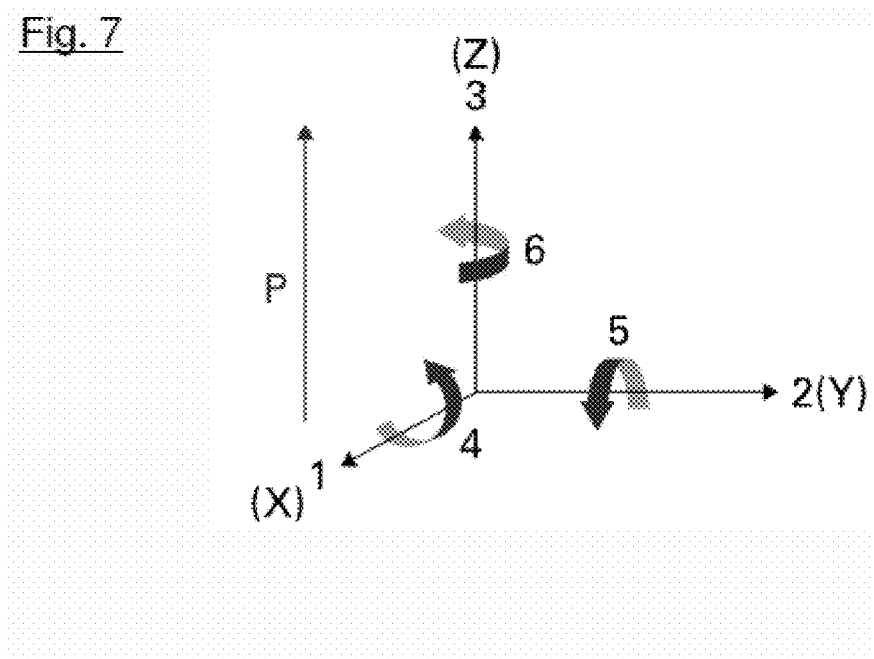
FIG. 7 is a line drawing evidencing a coordinate system as used to mark directions of polarization, coupling factor, and relative dielectric constant.

In order to determine directions in reference to the piezo elements used, as shown in FIG. 7, the axes 1, 2, and 3 are introduced, which are aligned like the X, Y, and Z axes of the Cartesian coordinate system. In addition, the directions of rotation about the respective axes, as also shown in FIG. 7, are marked with the numbers 4, 5, and 6. The axis 3 is here aligned along the direction of polarization of the respective piezo element. Due to the fact that the piezo-electric material is anisotropic, the respective physical parameters are described by tensors and indicated according to the above numbering of axes.

The coupling factor k is a measure for the embodiment of the piezo-electric effect. It describes the capacity of a piezo-electric material to convert electrical energy absorbed into mechanical energy and vice versa. The coupling factor is calculated here from the square root of the ratio of mechanical energy stored to energy stored overall. Under dynamic conditions, the coupling factor k depends on the respective vibration form of the piezo-electric body. The coupling factor of the longitudinal vibration $k_{33}$, i.e. the extent a piezo element converts an electric voltage applied in the direction of polarization into an extension in the direction of the axis 3, i.e. in the direction of the polarization, is particularly relevant for piezo-electric drives of vibration sensors of the present type.

In the same fashion, the dielectric constant ε and/or the relative dielectric constant $ε_r$ are dependent on the direction. $ε_r$ describes here the ratio of the dielectric constant ε of the piezo-electrical material and the dielectric constant $ε_0$, with the dielectric constant ε representing a measure for the polarizability of the piezo-electric material in the electric field. The function of the relative dielectric constant $ε_r$ of the direction of the electric field and the dielectric shift is also indicated by a respective indicator. $ε_{33}$ describes here the dielectric constant ε in the direction of polarization with an electric field applied also in the direction of polarization.

When in the present application a coupling factor is mentioned without any explicit indication or statement of direction, this shall represent the coupling factor in the 33-direction, i.e. parallel in reference to the polarization of the piezo element and in a direction perpendicular to the diaphragm of the vibration sensor. The same applies to the relative dielectric constant, which shall also be understood in the 33-direction without any explicit indication and statement of direction.

The use of appropriately different materials is advantageous when a first relative dielectric constant of the first piezo-electric material and a second relative dielectric constant of the second piezo-electric material show different temperature dependencies. In particular, it is advantageous when the first relative dielectric constant in the 33-direction and the second relative dielectric constant in the 33-direction show different temperature dependencies.

It is also advantageous for the material combination when a first coupling factor in the direction of the material polarization of the first piezo-electric material and a second coupling factor in the direction of the material polarization of the second piezo-electric material show different temperature dependencies. By appropriately different temperature dependencies, a material combination can be selected here for the drive which has a coupling factor sufficient for the operation of a vibration sensor for a wide temperature range, for example from −50° to +200°, advantageously to +250° or +300° C. in total.

When a piezo-electric material comes into the proximity of its Curie point, its coupling factor drops considerably with increasing temperature. This effect is particularly distinct starting at approximately 70% of the Curie point.

Advantageously, the first coupling factor has in a temperature range from −50° C. to +200° C. an approximately linear temperature dependency, i.e. change relative to temperature.

In particular, the first coupling factor may show in the temperature range a relative change of less than +/−15%, preferably less than +/−10%, and further preferred is at or less than +/−5%. Such a linear behavior at an approximately constant coupling factor ensures that the piezo-electric drive can be used reliably for the entire temperature range.

The first coupling factor may show in this temperature range, for example, values ranging from 10 to 20, preferably from 15 to 20.

The coupling factor in the 33-direction is defined as follows:

$$k_{33}^2 = \frac{W_{mech,3}}{W_{electr,3}} = \frac{0.5 \cdot d_{33}^2 \cdot U_3^2 \cdot b \cdot h/(s_{33}^E \cdot l)}{0.5 \cdot U_3^2 \cdot \varepsilon_{33}^T \cdot b \cdot h/l} = \frac{d_{33}^2}{s_{33}^E \cdot \varepsilon_{33}^T}.$$

With the components of the formula representing the following:

$K_{33}$—Coupling factor in the 33-direction
$W_{mech,3}$—mechanical work in the 33-direction
$W_{electr,3}$—electrical energy in the 33-direction
$U_3$—Electrode voltage in the 33-direction
b—Piezo width in the 22-direction
h—Piezo height in the 11-direction
l—Piezo length in the 33-direction
$d_{33}$—Piezo-electric charge constant in the 33-direction
$s_{33}^E$—Elastic flexibility constant in the 33-direction
$\varepsilon_{33}^T$—Relative dielectric constant in the 33-direction In order to ensure temperature detection as well as possible using a capacity measurement of the drive overall or an individual piezo element, it is advantageous for the second relative dielectric constant to show a relative change in the range of more than +/−10%, preferably more than +/−15%, particularly from −10% to +30%, preferably from −10% to +50%. By an appropriately large change of the second dielectric constant of the second piezo element, an appropriately distinct change of a capacity of a plate capacitor is yielded, which is formed by the piezo-electric elements, so that a temperature determination can occur with sufficient precision.

Preferably the second relative dielectric constant has in the temperature range a change of at least 30%, preferably at least 50%, particularly at least 80%, with here a numeric change being referred to over the entire temperature range.

In order to ensure sufficiently high coupling factors for the overall drive over the entire temperature range, it may be advantageous if the drive has at least two piezo elements made from a first piezo-electric material. The coupling factors of serial mechanical piezo elements are added here to an overall coupling factor of the drive.

It is advantageous for the coupling factor of the drive in the entire temperature range to amount to at least 20, preferably at least 25, further preferred at least 35, because this way at a predetermined bias of the drive, sufficient mechanical excitation of the diaphragm can be yielded.

It may be advantageous here for the first piezo element to show a Curie point of at least 300° C., preferably at least 320° C.

The second piezo element can then show, for example, a Curie point of 255° C. and thus a higher temperature dependency in said temperature range.

Typically, piezo-electric materials based on lead-zirconate-lead-titanate (PZT) are used for piezo-electric drives of vibration sensors according to the present application.

DETAILED DESCRIPTION OF THE FIGURES

Figure 1:
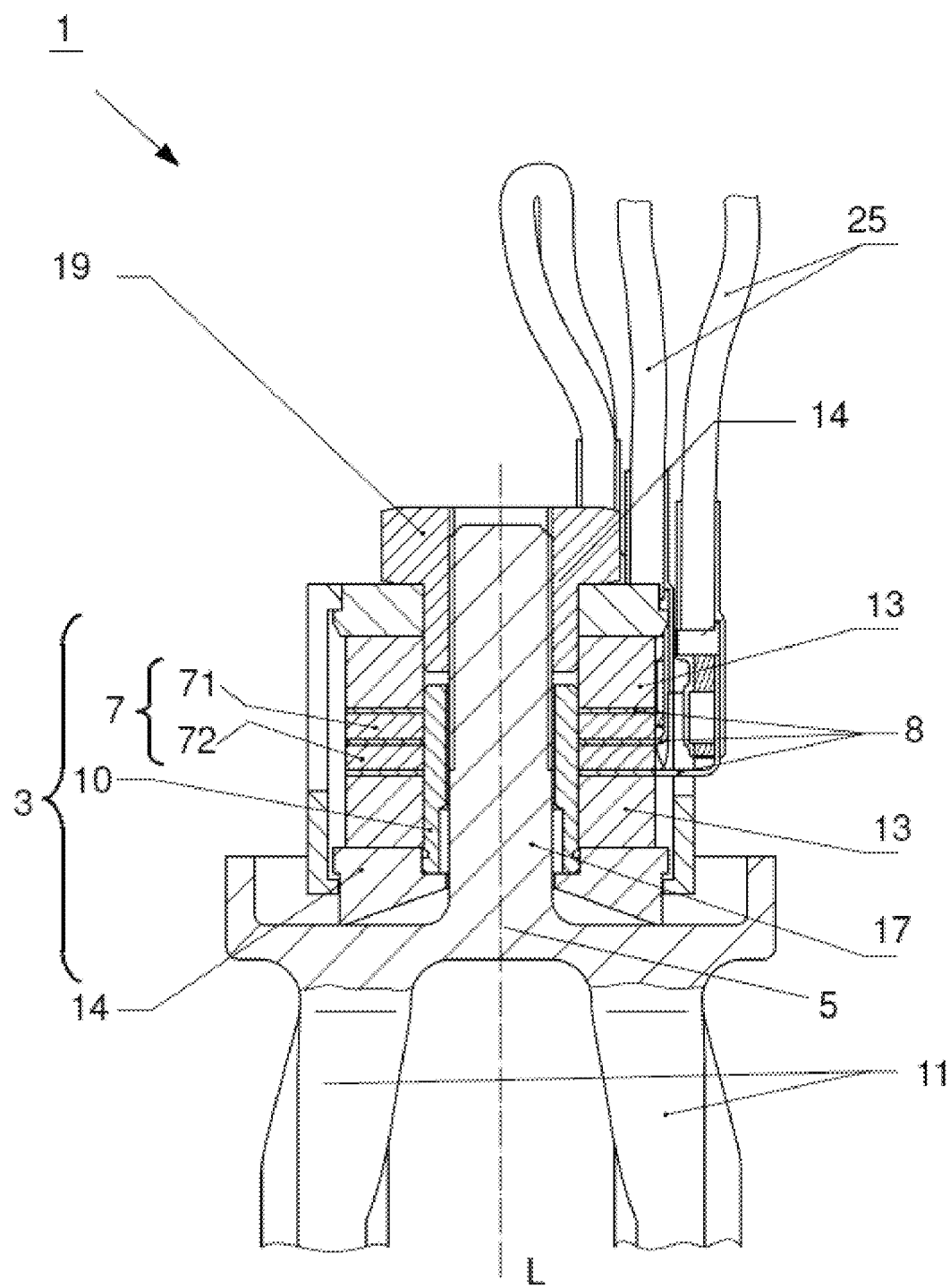
FIG. 1 is a line drawing evidencing a longitudinal section through a vibration sensor according to the present application.

FIG. 1 shows a longitudinal section through a vibration sensor 1 according to the present application. A housing as well as a sensor electronic are not shown in the present case for clarity.

The vibration sensor 1 shown essentially comprises a drive 3, which is screwed via a tension bolt 17 and a clamping screw 19 to a diaphragm 5. At a side of the diaphragm 5 opposite the drive 3, mechanical vibrators 11 are provided, for example in the form of paddles arranged at the diaphragm 5 and aligned parallel to each other.

A central component of the drive 3 is in the present exemplary embodiment a stack of two piezo elements 7, which in the following are marked as the first piezo element 71 and the second piezo element 72 in order for them to be distinguished. The piezo elements 7 are embodied in the form of rings in the present case and thus surround the tension bolt 17 in the circumferential direction. For the centered alignment of the piezo elements 7 as well as their electrical isolation from the metallic tension bolt 17, an isolating sleeve 10 is arranged between the tension bolt 17 and the piezo elements 71. The piezo elements 7 are electrically contacted via electrodes 8, with an electrical voltage being applied via the cables 25 extending at the rear. The electrodes 8 respectively contact a metal coat of the surface of the piezo elements 7, not shown in greater detail in the present figure.

The front side is understood in the present application as an orientation in the direction of the diaphragm 5, and the rear side is understood as an orientation away from the diaphragm 5.

At the front and rear of the piezo elements 7, respectively, one adjustment ceramic 13 is arranged for the purpose of electrical isolation.

In turn, at the front and the rear of the adjustment ceramics 13 the spring washers 14 are arranged by which the drive rests on the diaphragm 5 on the front and rear with the help of the clamping screw 19, screwed to the tension bolt 17, and thus biased in the direction of the diaphragm 5.

The first piezo element 71 and the second piezo element 72 are stacked on top of each other in the exemplary embodiment shown in FIG. 1 and thus mechanically switched serially. This means that a change in length of the first piezo element 71 and the second piezo element 72 in the direction of a longitudinal axis of the tension bolt 17 inside the drive 3 is added and thus allows yielding an increased stroke.

In a serial mechanical circuit, as shown in FIG. 1, the coupling factors of the stacked piezo elements 7 add to an overall coupling factor of the drive 3.

The vibration sensor can additionally have a communication unit to communicate with another unit, particularly for data communication and parameterization of the sensor. With this communication unit, the data of the sensor, particularly the temperature and capacity values, can be forwarded to the additional unit in which they can be processed and the sensor can be parameterized by the communication unit from a remote module. The communication unit is advantageously embodied in a wireless fashion, particularly as a radio module. It forms a beneficial and space-saving communication option.

Figure 2:
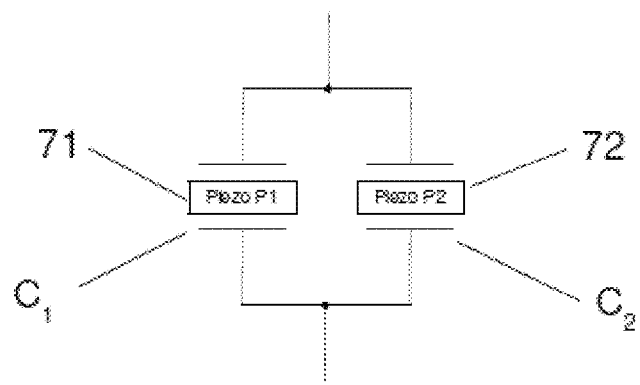
FIG. 2 is a line drawing evidencing an electrical flowchart of the drive of the vibration sensor of FIG. 1.

FIG. 2 shows an electrical equivalent circuit of the piezo elements 7 of FIG. 1. From this equivalent circuit it is discernible that the first piezo element 71 and the second piezo element 72 are switched parallel, in the electrical sense.

As discernible from FIG. 2, the first piezo element 71 forms a first capacity $C_1$ and the second piezo element 72 forms a second capacity $C_2$. By the electrical parallel circuitry here, the capacities $C_1$, $C_2$ add. By the electrical parallel circuitry here, the capacities$_1$, $C_2$ add to a total capacity $C_{tot}$ of the drive 3.

As discernible from the equivalent circuit, the piezo elements 7 are here considered the dielectric inside the plate capacitors so that any change of the relative dielectric constant $\varepsilon_r$ of the piezo-electric material of the respective piezo element leads to a change of the capacity of the corresponding plate capacitor. This way, by determining the total capacity $C_{tot}$ of the drive 3, as shown in the following, a determination occurs of the temperature of the piezo elements with sufficient precision.

Figure 3:
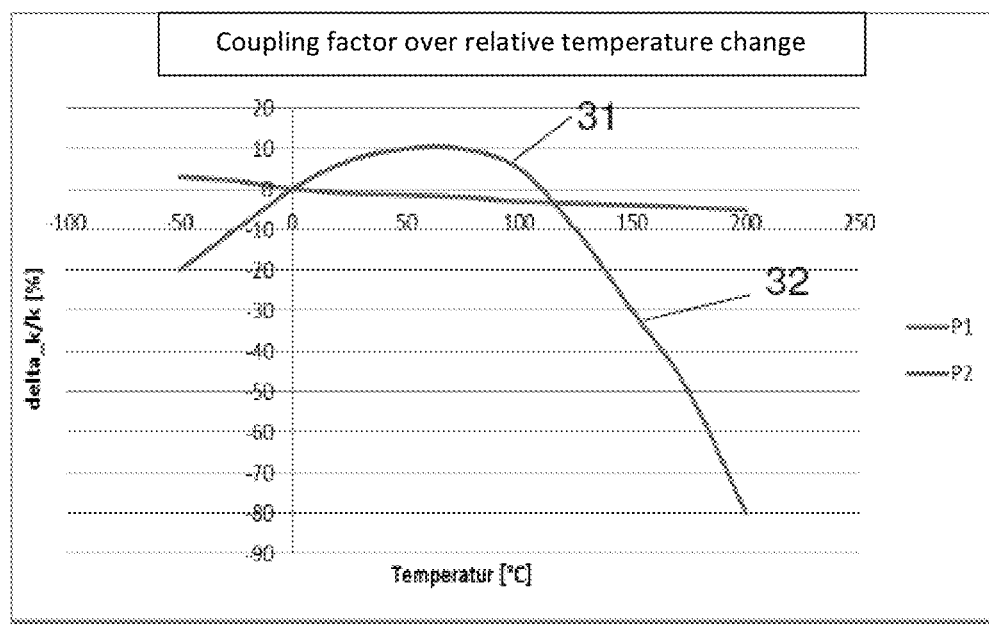
FIG. 3 is a line drawing evidencing a relative change of the coupling factor of the piezo element of the drive of FIG. 1 with the temperature.

FIG. 3 shows a relative change of the first coupling factor $k_1$ and the second coupling factor $k_2$ of the first piezo element 71 and/or the second piezo element 72. Respectively, the change of the coupling factor k is shown in the 33-direction of the piezo elements, with a polarization of the piezo elements being aligned in the direction of the longitudinal axis L of the tension bolt 17 and thus perpendicular to the diaphragm 5.

FIG. 3 shows with 31 the characteristic of the relative change of the first coupling factor $k_1$ of the first piezo element 71 and with 32 the relative change of the second coupling factor $k_2$ of the second piezo element 72, in reference to the temperature.

Figure 4:
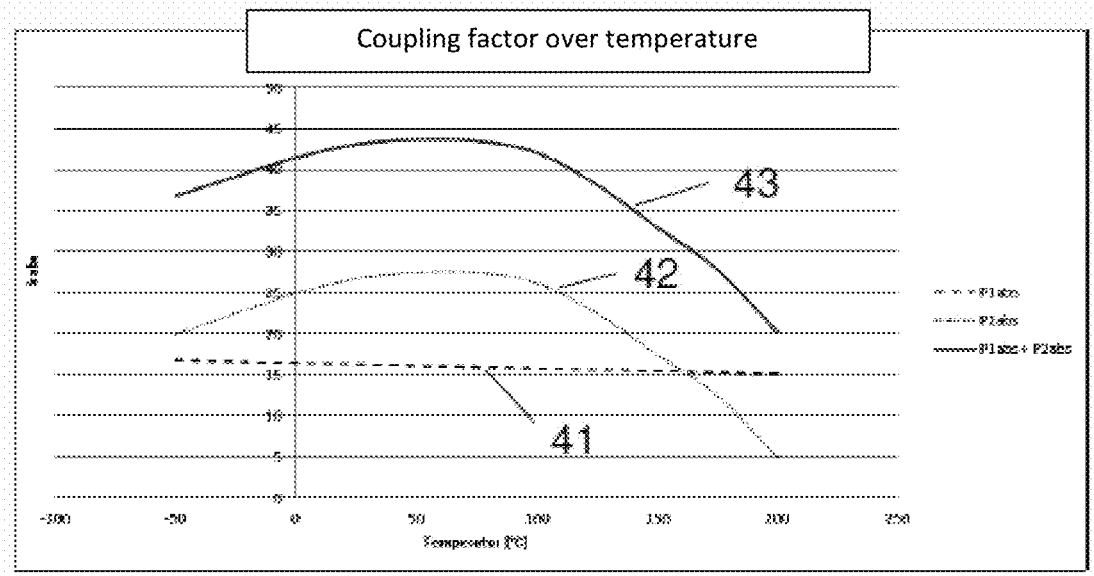
FIG. 4 is a line drawing evidencing an absolute change of the coupling factor of the piezo elements of the drive of FIG. 1 with the temperature.

As discernible from FIG. 3, the first coupling factor $k_1$ has in a temperature range from −50° C. to +200° C. a relative change of about +/−5%, with the first coupling factor $k_1$ additionally showing an extremely linear change behavior. The second coupling factor $k_2$ comprises, as discernible from the characteristic 32, a non-linear change behavior, with the characteristic 32 starting with a relative change of −20% at −50° C., rising almost linearly to the zero point, then reaches its maximum at approx. 60° C. and +10%, and drops sharply with increasing temperature. The characteristic 32 of the relative change of the second coupling factor $k_2$ intersects the X-axis at approximately 125° C. once more and then drops almost linearly to a value of −80% at +200° C. It is discernible from this characteristic that the second coupling factor $k_2$ of the second piezo element 72 drastically drops with increasing temperature. FIG. 4 shows the temperature dependency of the first coupling factor k1 (characteristic 41), the second coupling factor $k_2$ (characteristic 42), as well as the total of the first coupling factor $k_1$ and the second coupling factor $k_2$ (characteristic 43).

Here it is discernible from FIG. 4 that the first coupling factor $k_1$ develops in the temperature range from −50° C. to +200° C. almost linearly from a value of +17 to a value of +15.

The second coupling factor $k_2$ of the second piezo element 72 has in the temperature range stated a stronger temperature dependency, with the coupling factor starting at a temperature of −50° C. of +20 essentially rising linearly to approximately +25 at a temperature of 0° C., at a temperature of approximately 60° C. reaches its maximum with +27.5, and then drops up to a temperature of 200° C. to approximately +5.

The characteristic 43 shows the temperature dependency of the total coupling factor $k_{tot}$). The total coupling factor $k_{tot}$ results here from the addition of the first coupling factor $k_1$ and the second coupling factor $k_2$ of the first piezo element 71 and the second piezo element 72, which is equivalent to the addition of the characteristics 41 and 42 shown in the diagram in FIG. 4.

Figure 5:
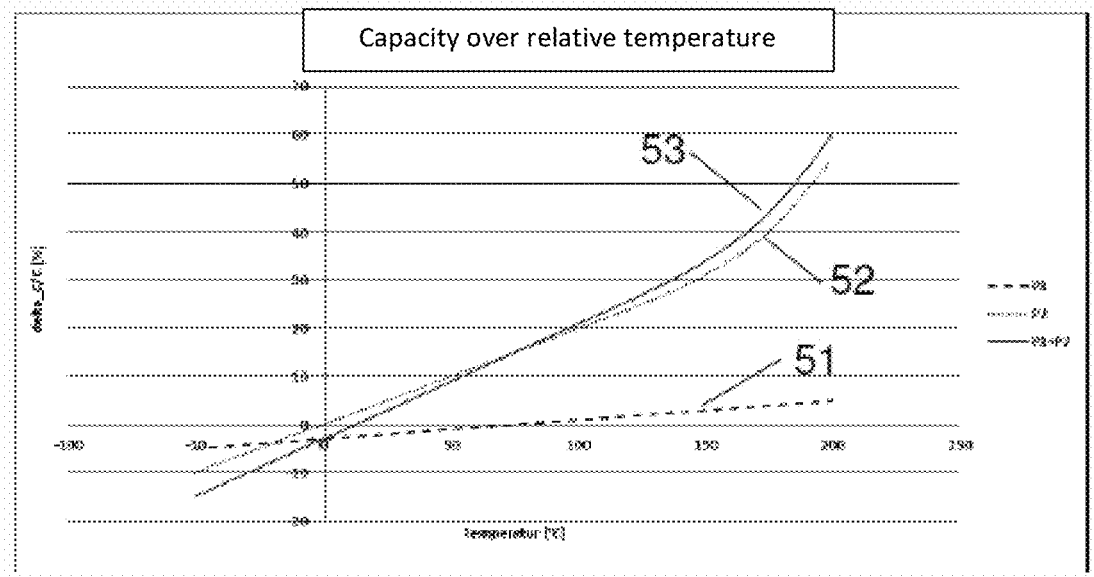
FIG. 5 is a line drawing evidencing a relative change of the capacity of the piezo elements of the drive of FIG. 1.

FIG. 5 shows the relative change of the first capacity $C_1$ (characteristic 51), of the second capacity $C_2$ (characteristic 52) as well as the total capacity $C_{tot}$ (characteristic 53) in reference to the temperature. The same characteristic also shows the relative change of the respective relative dielectric constant $\varepsilon_r$. Since under the assumption that an area A of the electrodes, by which the piezo elements 71, 72 are contacted and their distance d remains essentially constant, these values cancel each other out in the formula for calculating the capacity of a plate capacitor such that only the relative change of the relative dielectric constant remains. The formula for calculating the capacity of a plate capacitor is $$C = \varepsilon_0 \times \varepsilon_r \times A/d$$

With $\varepsilon_0$ marking the dielectric constant, $\varepsilon_r$ the relative dielectric constant of the material, A the area of the electrode, and d the distance of the electrodes.

It is discernible from FIG. 5 that the first capacity $C_1$ of the plate capacitor formed with the first piezo element 71 changes essentially linearly in the temperature range from −50° C. to +200° C. in a range of +/−5%, with the capacity rising, starting at −5% at −50° C. to +5% at 200° C.

The second capacity $C_2$ of the plate capacitor formed with the second piezo element 72 changes in the same temperature range from −10% to +55%, whereby in a temperature range from −50° C. to +125° C. an essentially linear increase occurs from −10% to +25% and then an increase with positive curvature to +55%. The relative temperature dependency of the total capacity $C_{tot}$ of the drive 3 is illustrated by the characteristic 53. The characteristic 53 is here the addition of the characteristics 51 and 52, so that the total capacity $C_{tot}$ increases from −15% to +60% at 200° C. Such a change in capacity can be well determined with common methods, so that a temperature can be clearly allocated to particularly each capacity change, allowing a temperature determination based on a capacity measurement.

FIG. 6 shows for a drive with two piezo elements made from the first piezo-electric material and a piezo element comprising the second piezo-electric material, the temperature dependency of the coupling factor k of the individual piezo elements as well as the total coupling factor already explained with reference to FIG. 4. By providing two piezo elements made from the first piezo-electric material, the total coupling factor is shifted further upwards so that overall a coupling factor is yielded of greater than 35 over the entire temperature range.

Having learned the present invention, for one trained in the art it is easily possible to reach suitable material combinations in order to yield a sufficient coupling factor over the entire temperature range with simultaneously sufficiently strong temperature dependency for a total capacity of the drive such that a temperature determination is possible based on a capacity measurement without any additional sensors.

LIST OF REFERENCE NUMBERS

1 Vibration sensor
3 Drive
5 Diaphragm
7 Piezo elements
8 Electrodes
9 Opening
10 Sleeve
11 Mechanical vibrator
13 Adjustment ceramics
14 Spring washer
17 Tension bolt
19 Clamping screw
22 Temperature sensor
25 Cable
31 relative change $k_1$
32 relative change $k_2$
41 change $k_1$
42 change $k_2$
43 change $k_{tot}$
71 First piezo element
72 Second piezo element
$\varepsilon_0$ Dielectric constant
$\varepsilon_{r1}$ First relative dielectric constant
$\varepsilon_{r2}$ Second relative dielectric constant
$k_1$ First coupling factor
$k_2$ Second coupling factor
$k_{ges}$ Total coupling factor
$C_1$ First capacity
$C_2$ Second capacity
$C_{ges}$ Total capacity
L Longitudinal axis The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A vibration sensor with an integrated temperature detection, such vibration sensor comprising:
    a diaphragm that can be set into vibration, and
    a piezo-electric drive for setting the diaphragm into vibration and for detecting vibrations of the diaphragm, with the drive comprising at least two serial mechanical piezo elements,
    wherein at least a first piezo element is formed from a first piezo-electric material and at least a second piezo element from a second piezo-electric material, and a temperature is determined by detecting a capacity of at least one piezo element, a first relative dielectric constant of the first piezo-electric material and a second relative dielectric constant of the second piezo-electric material show a different temperature dependency, and a first coupling factor has different material and a second coupling factor in the direction of the material polarization of the second piezo-eccentric material.

2. The vibration sensor according to claim 1, wherein each of the first and second piezo-electric material is a different lead-zirconate-lead-titanate (PZT), and wherein a first coupling factor has an almost linear change in a temperature range from −50° C. to +200° C.

3. The vibration sensor according to claim 2, wherein the first coupling factor ($k_1$) has in the temperature range a relative change of less than +/−15%.

4. The vibration sensor according to claim 2, wherein the first coupling factor has in the temperature range values ranging from 10 to 20.

5. The vibration sensor according to claim 2, wherein the second relative dielectric constant ($\varepsilon_{r2}$) has in the temperature range a relative change of more than +/−10%.

6. The vibration sensor according to claim 2, wherein the second relative dielectric constant in the temperature range has a change of at least 30%.

7. The vibration sensor according to claim 1, wherein the drive has at least two piezo elements made from the first piezo-electric material.

8. The vibration sensor according to claim 1, wherein the drive comprises a coupling factor of at least 20.

9. The vibration sensor according to claim 1, further comprising wherein a piezo element at the membrane side is made from the second piezo-electric material.

10. The vibration sensor according to claim 1, wherein the first piezo element has a Curie point of at least 300° C.

11. The vibration sensor according to claim 1, wherein the second piezo element has a Curie point of 255° C.

12. The vibration sensor according to claim 1, wherein the vibration sensor has a radio module for data communication with another unit and parameterization of the vibration sensor.

* * * * *